US011459792B2

(12) United States Patent
Westphall et al.

(10) Patent No.: US 11,459,792 B2
(45) Date of Patent: Oct. 4, 2022

(54) ROTATED HOOD LATCH

(71) Applicant: HEWLETT PACKARD ENTERPRISE DEVELOPMENT LP, Houston, TX (US)

(72) Inventors: Paul E. Westphall, Houston, TX (US); Keith Sauer, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 589 days.

(21) Appl. No.: 16/393,513

(22) Filed: Apr. 24, 2019

(65) Prior Publication Data
US 2020/0340272 A1    Oct. 29, 2020

(51) Int. Cl.
*E05B 17/00*    (2006.01)
*E05B 65/08*    (2006.01)
(Continued)

(52) U.S. Cl.
CPC .......... *E05B 17/0025* (2013.01); *E05B 65/08* (2013.01); *G06F 1/182* (2013.01);
(Continued)

(58) Field of Classification Search
CPC ...... E05B 17/0025; E05B 65/08; E05B 5/006; E05B 5/003; G06F 1/182; G06F 1/1601; G06F 1/181; G06F 1/18; G06F 1/187; H05K 5/0226; H05K 5/023; H05K 5/0021; H05K 5/03; H05K 5/02; H05K 5/0239; H05K 5/0217; H05K 5/0221; H05K 5/0204; H05K 7/1487; H05K 7/1488; E05Y 2900/606; E05C 1/00; E05C 1/004;
(Continued)

(56) References Cited

U.S. PATENT DOCUMENTS 4,335,595 A  *  6/1982  Swan ...................... E05C 1/145
                                                    292/DIG. 31
6,398,325 B1     6/2002  Chen et al.
(Continued)

FOREIGN PATENT DOCUMENTS

CN    207829660    *    9/2018
CN    109209060    *    1/2019
(Continued)

*Primary Examiner* — Janet M Wilkens
(74) *Attorney, Agent, or Firm* — Hewlett Packard Enterprise Patent Department (57) ABSTRACT

Apparatuses and systems described herein provide hood latch designs for removable hoods of chassis of computing devices. A hood latch for the removable hood of a chassis includes an actuator that has an oblong aperture. A direction of a long dimension of the oblong aperture is offset from an actuator-open direction by an acute angle. A pin rigidly attached to a base portion of the chassis rests in the oblong aperture. When the actuator moves from an actuator-closed position to an actuator-open position, the actuator pushes against the pin and the pin slides from a pin-closed position within the aperture to a pin-open position within the aperture. Since the pin is rigidly attached to the chassis and the hood latch is affixed to the hood, hood slides from a hood-closed position to a hood-open position as the actuator moves from the actuator-closed position to the actuator-open position.

14 Claims, 11 Drawing Sheets

(51) Int. Cl.
*H05K 7/14* (2006.01)
*H05K 5/02* (2006.01)
*G06F 1/18* (2006.01)
*E05B 5/00* (2006.01)

(52) U.S. Cl.
CPC ........... *H05K 5/023* (2013.01); *H05K 5/0226* (2013.01); *H05K 7/1487* (2013.01); *H05K 7/1488* (2013.01); *E05B 5/006* (2013.01); *E05Y 2900/606* (2013.01)

(58) Field of Classification Search
CPC ..... E05C 1/02; E05C 1/06; E05C 1/04; E05C 1/10; E05C 1/065; E05C 19/06; E05C 19/006; Y10T 292/096; Y10T 292/1015; Y10T 292/102; Y10T 292/1016; Y10T 292/11
USPC ........ 312/223.2, 244, 332.1; 220/345.1, 351, 220/345.4; 49/463; 174/50; 361/379.33, 361/679.37, 679.58, 726, 727
See application file for complete search history.

(56) References Cited

U.S. PATENT DOCUMENTS

| | | |
|---|---|---|
| 6,407,912 B1 | 6/2002 | Chen et al. |
| 6,616,201 B1 * | 9/2003 | Liang ...................... G06F 1/181 70/58 |
| 6,824,174 B2 | 11/2004 | Lin et al. |
| 6,918,274 B2 | 7/2005 | Gladden et al. |
| 7,614,672 B2 | 11/2009 | Smith et al. |
| 7,843,698 B2 * | 11/2010 | Takizawa ................ G06F 1/181 361/801 |
| 9,207,721 B2 * | 12/2015 | Conn .................... H05K 5/0221 |
| 10,619,386 B2 * | 4/2020 | Chen ..................... E05B 65/006 |
| 10,798,837 B1 * | 10/2020 | Sauer .................... H05K 7/1488 |
| 2009/0290322 A1 * | 11/2009 | Chang .................. H05K 5/0221 361/837 |
| 2011/0157779 A1 * | 6/2011 | Chang .................. H05K 5/0221 361/679.01 |
| 2015/0315811 A1 * | 11/2015 | Mao ....................... E05B 5/003 292/336.3 |
| 2017/0191292 A1 * | 7/2017 | Chen ....................... E05C 1/065 |
| 2017/0202099 A1 | 7/2017 | Nguyen et al. |
| 2019/0394889 A1 * | 12/2019 | Wu ......................... G06F 1/181 |

FOREIGN PATENT DOCUMENTS

| | | | |
|---|---|---|---|
| CN | 113050759 | * | 6/2021 |
| EP | 3623901 | * | 3/2020 |
| WO | 2006018875 | * | 2/2006 |

* cited by examiner

ROTATED HOOD LATCH

BACKGROUND

Many consumer products and industrial products include chassis enclosures that protect internal components and provide frames to which those components can be mounted. For example, many electrical devices such as audio mixers, radio receivers, network switches, personal computers, and servers are often enclosed within chassis.

Modern servers are used to provide a wide array of services to client computers via computer networks such as the Internet. For example, web servers provide web pages to clients via the Internet, mail servers provide email services, and file servers both provide downloadable files and store uploaded files.

Several different form factors exist for servers. A tower server is typically a freestanding unit that is suitable for contexts where a single server can manage a projected workload. Rack servers are more compact than tower servers and are therefore suitable for contexts where multiple servers are stored in close proximity (e.g., in a server farm), but are still self-contained. Blade servers are more compact than rack servers, but generally share components such as switches, ports, and power connectors.

BRIEF DESCRIPTION OF THE DRAWINGS

Various features and advantages will become apparent from the following description, given by way of example only, which is made with reference to the accompanying drawings, of which.

DETAILED DESCRIPTION

For many types of products that include chassis, compactness is desirable. A compact product can be stored in a smaller space than a larger product, thus leading to reduced costs for rental space or storage space. Compactness also tends to increase portability, which is convenient when products are moved, rearranged, or shipped.

Accessibility is also desirable for many types of products that include a chassis. For this reason, many chassis include a removable hood so that the contents stored therein can be accessed easily. A removable hood may include a mechanism for securing the hood to the chassis.

In general, to achieve compactness, product designers seek out ways to pack the internal components of a product together in as small of a space as they can without interfering with the safety, stability, and function of those components. The question of how to pack components into a chassis of a given size may reduce to a variation of the so-called Knapsack problem—a problem that is non-polynomial-complete (NP-complete). Thus, finding a highly efficient way to pack a given set of components into a chassis of a particular size may not be trivial. The problem is further complicated if the interior space of the chassis is obstructed by a mechanism that secures the hood to the chassis. If the mechanism is constrained to a particular position or orientation within the chassis, the problem is complicated even further.

Apparatuses described herein provide mechanisms that can secure a hood to a chassis without being subject to orientation constraints and position constraints that apply to existing mechanisms. Servers are one example of a product in which these and other advantages of the apparatuses described herein are helpful. For this reason, many of the examples and figures provided herein refer to server chassis. However, the examples provided herein are for illustrative purposes only. Persons of skill in the art will recognize that the apparatuses described herein are useful for many other types of products that include a chassis and a hood.

Rack servers are one example of a product for which compactness is generally desirable (although other examples are legion). Rack servers include components such as processors, motherboards, dual in-line memory modules (DIMMs), buses, hard drives, heat sinks, fans, and power supplies. Consumers are often attracted to the compactness that rack servers offer.

To achieve that compactness, engineers who design rack servers are obliged to pack many components closely together within a server chassis. However, the engineers are also obliged to consider how the spacing and placement of those components will influence how air circulates within the chassis. Specifically, if the number of fans included in the chassis is insufficient or the positions or orientations of those fans are poorly selected, the server may struggle to maintain thermal control while handling heavy workloads. Poor thermal control may reduce the life of server hardware or lead to component throttling that hampers the quality of experience (QoE) for clients that communicate with the server.

Even in robust servers that have good thermal control, individual components within rack servers occasionally have to be replaced for system repairs and upgrades. Also, some internal server components may have to be serviced on occasion.

Since component replacement and servicing is to be expected, the chassis of a rack server may contain a removable hood. When the hood is removed, technicians can access components that are to be serviced, upgraded, or replaced. A server hood may contain a hood latch with an exterior handle that, when pulled, pushes an actuator component against a pin that is rigidly affixed to a base portion of the server chassis. The force of the actuator against the pin causes the hood to slide backward from a closed position to an open position. Once the hood is in the open position, the hood can be removed and the components housed within the server chassis can be serviced or replaced.

A suitable pin for a server chassis should be sturdy enough to withstand a force sufficient to slide the hood (which may be relatively heavy) back and forth between an open position and a closed position without appreciably bending. A suitable hood latch should also be sturdy enough to withstand such forces repeatedly without breaking.

The pin is generally centered within the base portion of the chassis and the hood latch is generally centered along a front edge of the hood so that the hood will not twist while sliding between the open position and the closed position. The hood latch is oriented such that the handle rotates upward about an axis that is orthogonal to the directions in which the hood slides when moving between the open and closed positions. The handle provides leverage for sliding the actuator. The actuator is oriented such that the actuator slides in a direction opposite to the direction in which the hood moves when sliding between the open and closed positions.

The position of the pin and the orientation of the hood latch may oblige engineers to place some server components, such as fans, in positions that are not ideal to ensure that there is sufficient space to accommodate the pin and the hood latch. Also, engineers may have to alter the shapes of some components to provide adequate space for the pin and the hood latch. For example, an engineer may elect to shorten several fins of a heat sink to provide space for a hood latch.

Apparatuses of the present disclosure provide several advantages over existing hood latches. For example, apparatuses disclosed herein provide actuator designs that allow the orientation of a hood latch to be different from the orientations used in existing hood latches. Furthermore, apparatuses disclosed herein allow pins for hood latches to be located in positions within a chassis that existing designs do not accommodate. By providing better orientation options and placement options for hood latches and pins, the apparatuses disclosed herein allow product designers to select better positions, orientations, and shapes for components that are stored in a chassis. These and other advantages will be evident in the discussion that follows.

Figure 1:
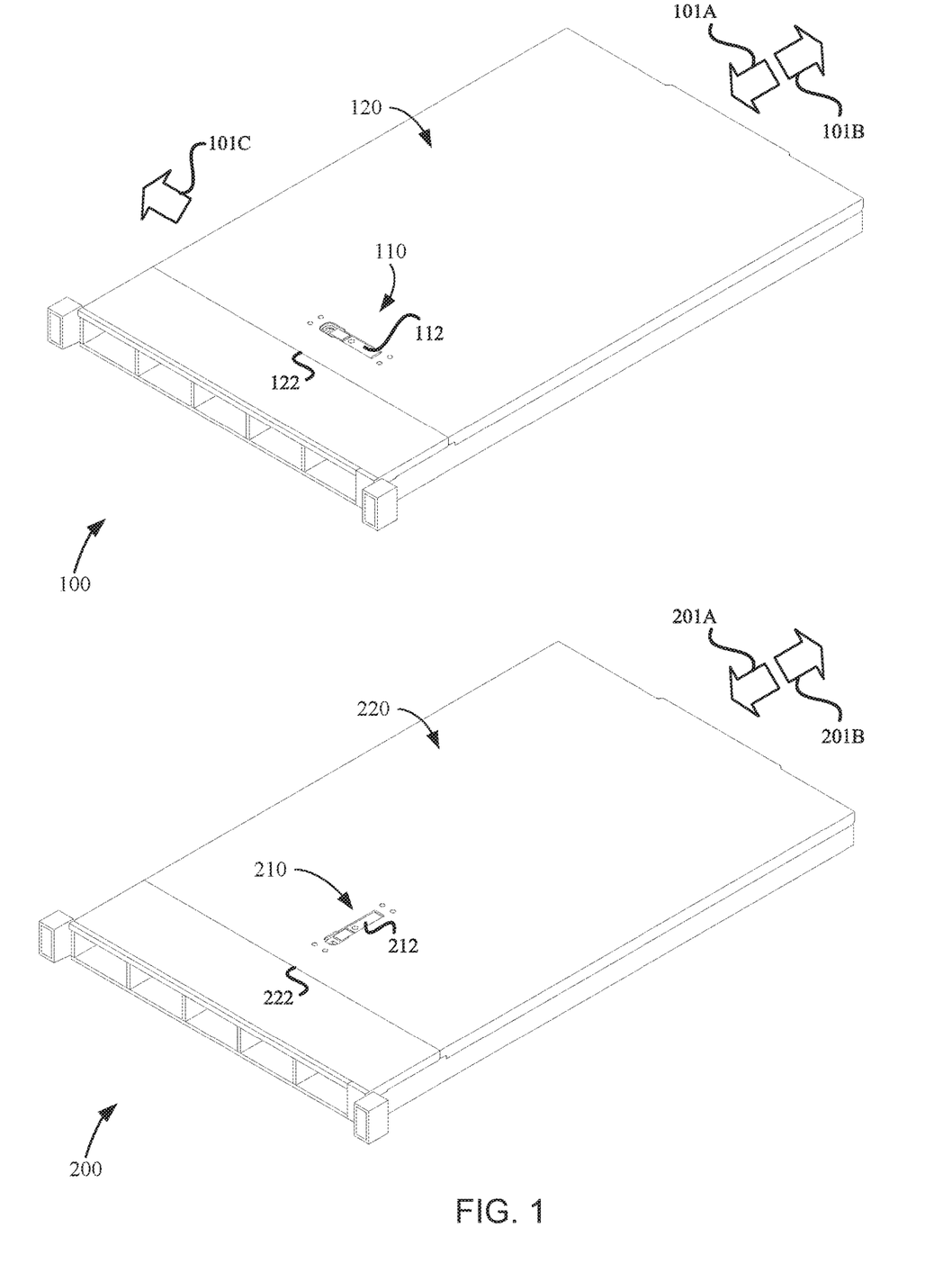
FIG. 1 illustrates a perspective view of two server chassis that have a hood latches in different orientations, according to one example.

FIG. 1 illustrates a perspective view of two server chassis that have a hood latches in different orientations, according to one example. Specifically, the hood latch 110 is positioned proximal to the front edge 122 of the hood 120 of the chassis 100. Similarly, the hood latch 210 is positioned proximal to the front edge 222 of the hood 220 of the chassis 200. The hood latch 110 is affixed to the hood 120, while the hood latch 210 is affixed to the hood 220.

The hood latch 210 is oriented to align lengthwise with the hood 220 such that the handle 212 of the hood latch 210 rotates about an axis that is orthogonal to the directions in which the hood 220 slides when moving between a hood-open position and a hood-closed position (the hood 220 is shown in the hood-closed position in FIG. 1). Arrow 201A illustrates the direction the hood 220 slides when moving from the hood-closed position to the hood-open position, while arrow 201B illustrates the direction the hood 220 slides when moving from the hood-open position to the hood-closed position. When the handle 212 is rotated upward from a handle-closed position (shown) to a handle-open position, a geometric feature at an end of the handle 212 that is proximal relative to the axis about which the handle 212 rotates engages with an actuator of the hood latch 210 and pushes the actuator forward (i.e., in the direction indicated by arrow 201A) relative to the hood 220 from an actuator-closed position to the actuator-open position.

The actuator pushes forward against a pin (shown in later drawings) that is rigidly attached to the chassis 200. Per Newton's third law, an opposing force pushes the hood 220 backward (i.e., in the direction indicated by arrow 201B) when the actuator pushes against the pin. The opposing force may be applied to the hood 220 via a hinge (of the hood latch 110) about which the handle 212 rotates. The opposing force causes the hood 220 to slide backward relative to the chassis 200 from the hood-closed position into the hood-open position.

By contrast, the hood latch 110 is oriented such that the handle 112 of the hood latch 110 rotates about an axis that is parallel to the directions in which the hood 120 slides when moving between an open position and a closed position (the hood 120 is shown in the closed position in FIG. 1). Arrow 101A illustrates the direction the hood 120 slides when moving from the closed position to the open position, while arrow 201B illustrates the direction the hood 120 slides when moving from the open position to the closed position. When the handle 112 is rotated upward from a handle-closed position (shown) to a handle-open position, a geometric feature at an end of the handle 112 that is proximal relative to the axis about which the handle 112 rotates engages with an actuator of the hood latch 110 and pushes the actuator sideways (i.e., in the direction indicated by arrow 101C) relative to the hood 120 from an actuator-closed position to the actuator-open position.

However, if the actuator of the hood latch 110 were to engage with a pin that is rigidly attached to the chassis 100 in the same way that the actuator of the hood latch 210 engages with the pin of the chassis 200, the resulting opposite force would not push the hood 120 in the direction indicated by arrow 101B. As a result, the hood 120 would not properly slide from the hood-closed position (shown) into the hood-open position. Therefore, in order for the hood latch 110 to function as desired (e.g., to move the hood from the hood-closed position to the hood-open position when the handle 112 rotates from the handle-closed position to the handle-open position), it is advantageous to use a different actuator design for the hood latch 110. Some example actuator designs that are suitable for hood latches oriented like the hood latch 110 are provided in the figures described below.

Figure 2A:
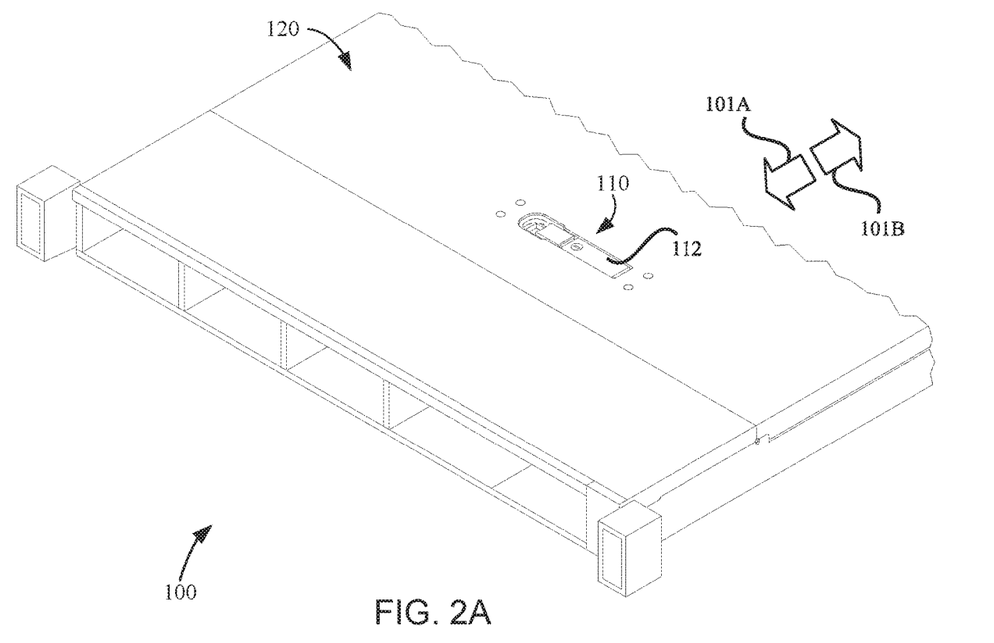
FIG. 2A illustrates a cutoff view of a chassis and a hood when the hood is in a hood-closed position, according to one example.

FIG. 2A illustrates a cutoff view of the chassis 100 and the hood 120 when the hood 120 is in the hood-closed position, according to one example. As shown in FIG. 2A, the handle 112 is in the handle-closed position.

Figure 2B:
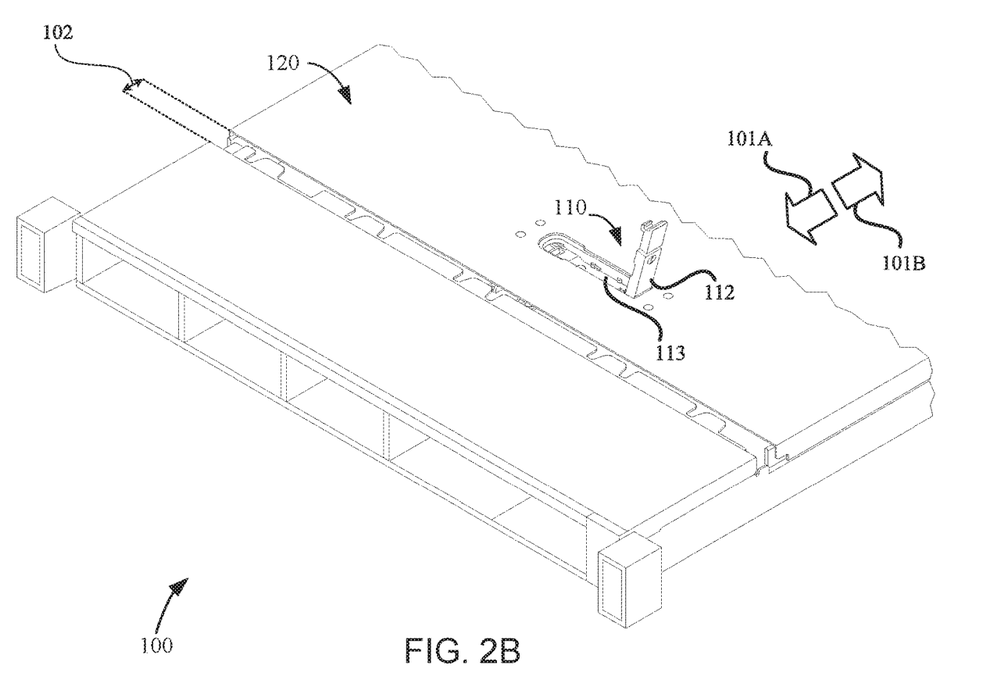
FIG. 2B illustrates a cutoff view of a chassis and a hood when the hood is in a hood-open position, according to one example.

FIG. 2B illustrates a cutoff view of the chassis 100 and the hood 120 when the hood 120 is in the hood-open position, according to one example. As shown in FIG. 2B, the handle 112 is in the handle-open position such that the actuator 113 of the hood latch 110 is visible. As shown, the hood 120 has been shifted backward (i.e., in the hood-open direction indicated by arrow 101B) by a movement distance 102. The movement distance 102 may be related to one or more dimensions of an aperture in the actuator 113 that interacts with a pin of the chassis 100, as described in greater detail below.

Figure 3:
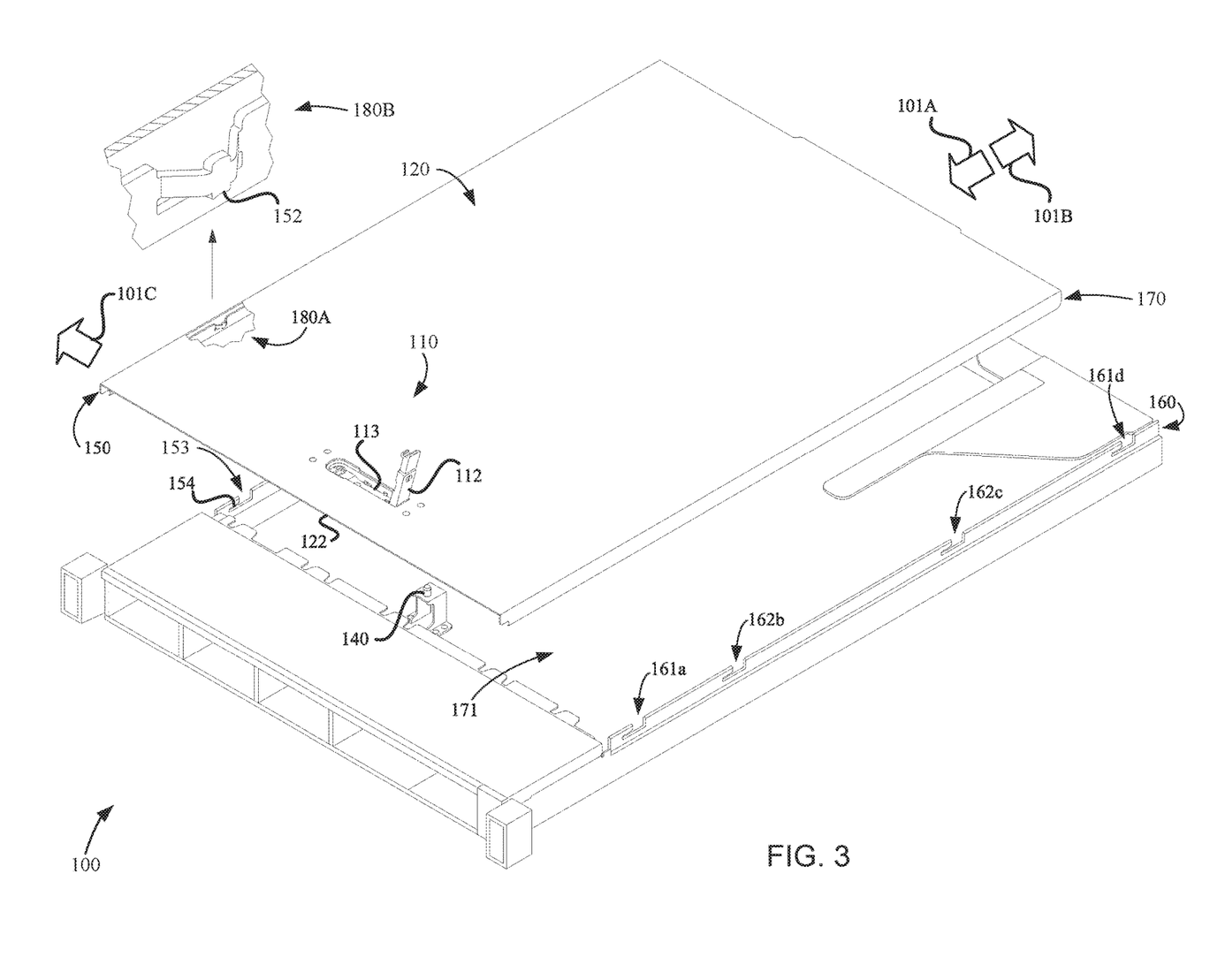
FIG. 3 illustrates a view of a chassis with a hood removed so that additional features of the chassis and the hood are visible, according to one example.

FIG. 3 illustrates a view of the chassis 100 with the hood 120 removed so that additional features of the chassis 100 and the hood 120 are visible, according to one example. The handle 112 is shown in the handle-open position such that the top of the actuator 113 is visible. A ridge 160 of the chassis 100 that underlays the ridge 170 of the hood 120 when the hood 120 is in the hood-closed position is also visible. The part of the chassis 100 that remains when the hood 120 is removed can be referred to as the base portion of the chassis 100. When the hood 120 is removed, the opening 171 at the top of the base portion of the chassis 100 is visible. A pin 140 is rigidly attached to the chassis 100 and extends upward toward the opening 171. When the hood 120 is moved from the hood-closed position to the hood-open position, the hood 120 slides along the cross-sectional plane of the opening 171 in the hood-open direction.

The L-shaped cutouts 161a-d engage with corresponding hood-locking forms on the inner side of the ridge 170 when the hood 120 is in the hood-closed position. Similarly, as shown in the enlarged view 180B of the cutaway viewing area 180A, hood-locking form 152 is disposed along the inner side of ridge 150. When the hood is in the hood-closed position, the hood-locking form 152 partially rests within the recess 154 of the L-shaped cutout 153 to prevent the hood 120 from being moved upward (i.e., in a direction orthogonal to the cross-sectional plane of the opening 171 in the chassis 100 that the hood 120 covers) when the hood 120 is in the hood-closed position. However, when the hood 120 is in the hood-open position, the hood-locking form 152 does not rest in the recess 154 and the hood 120 can be moved upward. The width of the recess 140 may be related to one or more dimensions of an aperture in the actuator 113 that interacts with the pin 140, as is described in further detail below.

Also, note that the overlay relationship between the ridge 170 and ridge 160 and the overlay relationship between ridge 150 and the ridge on which the L-shaped cutout 53 is located prevents the hood 120 from moving sideways (e.g., in the direction indicated by arrow 101C) when the hood 120 moves between the hood-open position and the hood-closed position.

Figure 4:
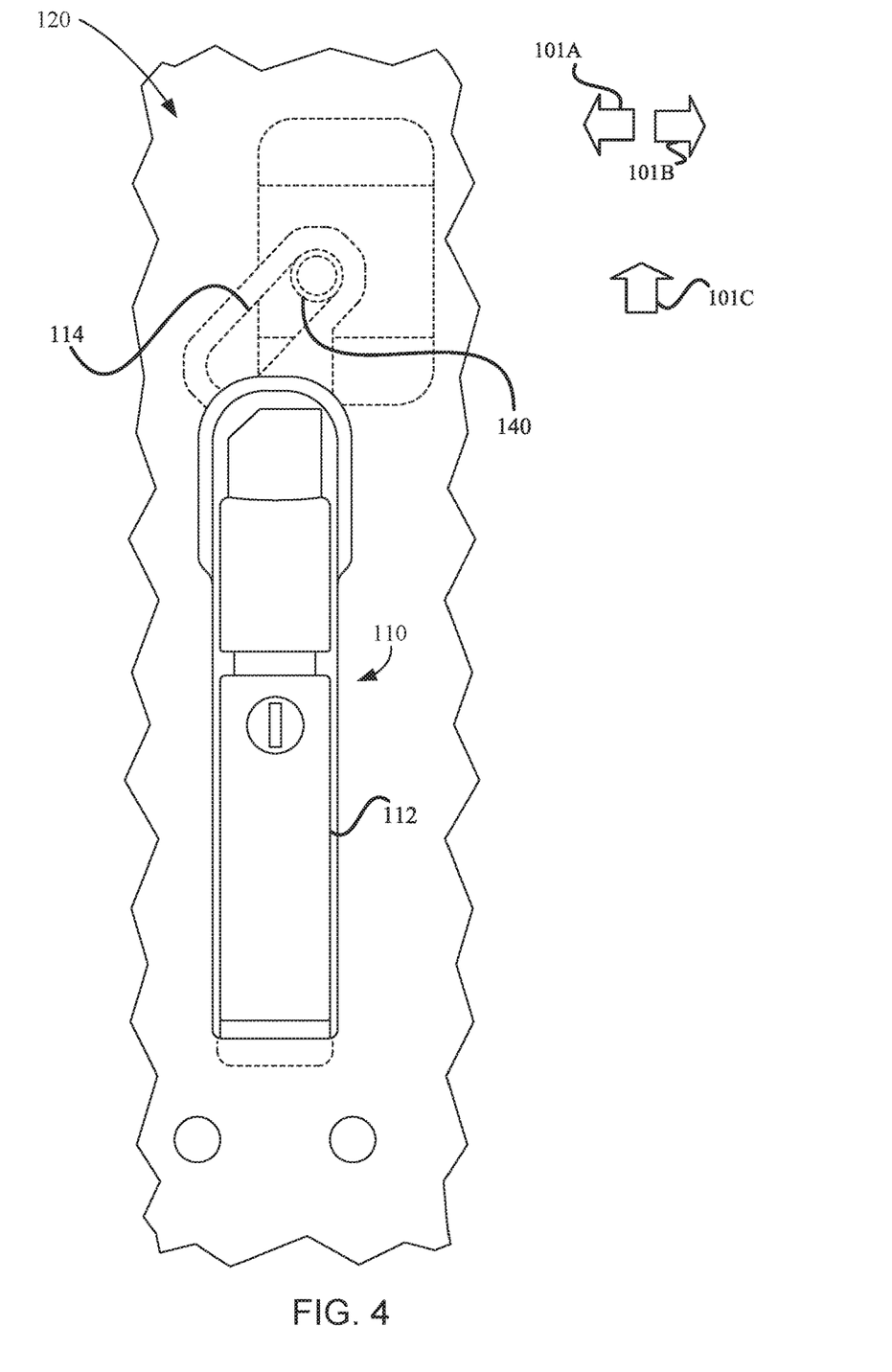
FIG. 4 illustrates a close-up top-down view of a hood latch when a handle of the hood latch is in a handle-closed position, according to one example.

FIG. 4 illustrates a close-up top-down view of the hood latch 110 when the handle 112 is in the handle-closed position, according to one example. The dashed lines in FIG. 4 outline features that are beneath the top surface of the hood 120 when the hood 120 is in the hood-closed position. Specifically, the actuator 113 includes an aperture 114 in which the pin 140 rests when the hood is in the hood-closed position as shown (or in the hood-open position).

The hood latch 110 is mounted to the hood 120 in a manner that allows the actuator 113 to slide in the direction indicated by arrow 101C (and back again) relative to the hood 120, but not in the directions indicated by arrow 101A and arrow 101B relative to the hood 120. Therefore, if the actuator 113 moves in the direction indicated by arrow 101B relative to the pin 140, the hood 120 also moves by the same amount in the direction indicated by arrow 101B.

Figure 5A:
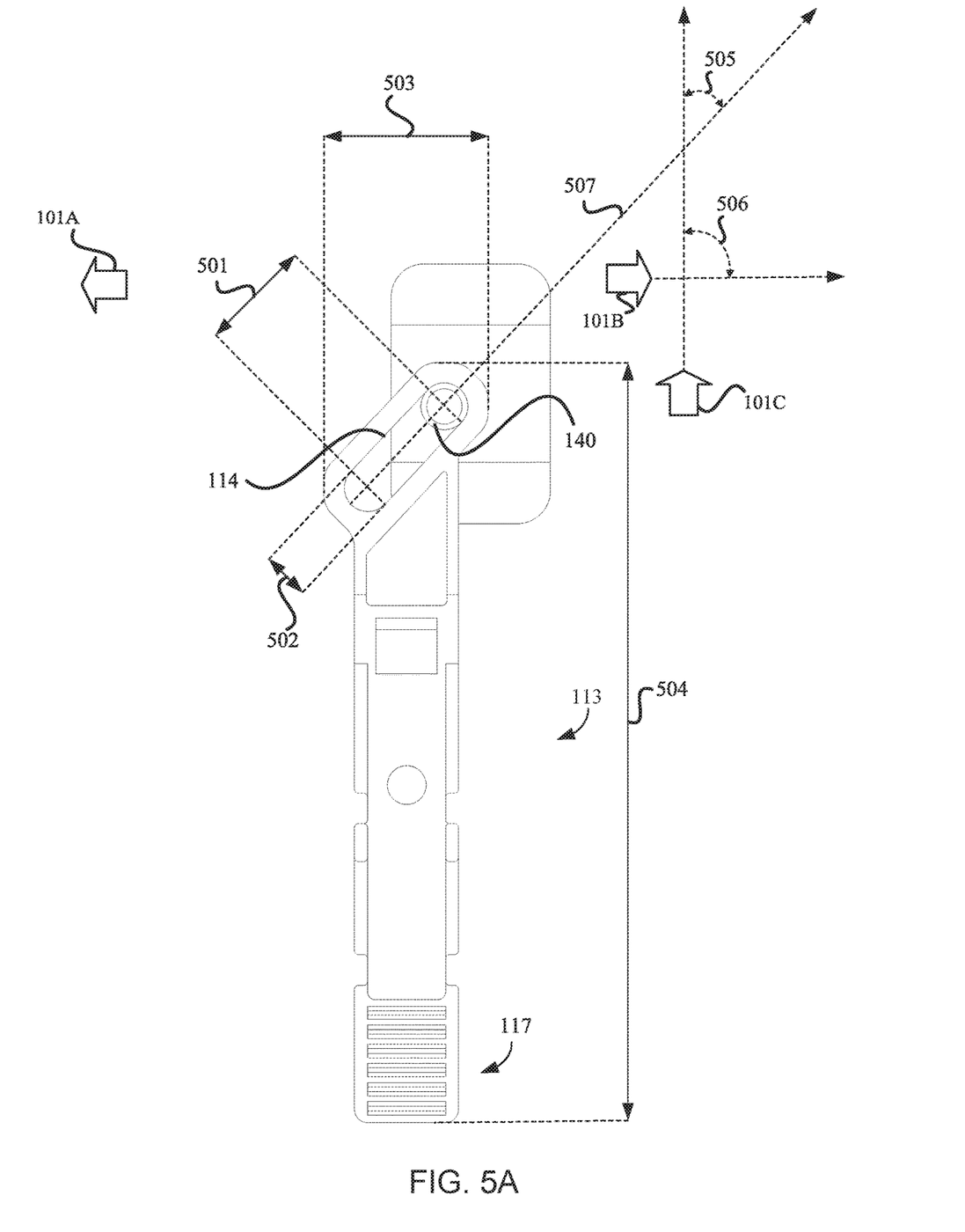
FIG. 5A illustrates a close-up top-down view of a hood-latch actuator and a pin when the actuator is in an actuator-closed position, according to one example.

FIG. 5A illustrates a close-up top-down view of the actuator 113 and the pin 140 when the actuator 113 is in the actuator-closed position, according to one example. Other parts of the chassis 200, the hood 120, and the hood latch 110 are not shown in FIG. 5A so that features of the actuator 113 can be shown more clearly.

When the actuator 113 is in the actuator-closed position as shown, the pin 140 rests at a pin-closed position within the aperture 114 as shown. The aperture 114 is oblong (i.e., a first dimension of the aperture 114 is longer than a second dimension of the aperture 114). Specifically, in this example, the cross-sectional shape of the aperture 114 is an obround (a.k.a. a stadium). An obround is a two-dimensional shape that can be conceptualized in the following manner. First, imagine a first 180-degree arc (e.g., a half-circle). Next, imagine a chord that connects the endpoints of the arc. Next, add a second arc that is a reflection of the first arc across the chord. Next, move (e.g., translate) the second arc away from the first arc in a direction perpendicular to the chord. Now connect a first endpoint of the first arc to a corresponding endpoint of the second arc that is the reflection of the first endpoint by adding a first line segment is tangent to the first endpoint. Finally, connect a second endpoint of the first arc to a corresponding endpoint of the second arc that is the reflection of the second endpoint by adding a second line segment that is tangent to the second endpoint. The result is the two-dimensional shape referred to herein as an obround. The radius of the arcs of an obround is referred to herein as the radius of the obround. The diameter of the arcs may be referred to as the short dimension of the obround, while the length of the line segments of the obround may be referred to as the long dimension of the obround.

In the example shown in FIG. 5A, the radius of the cross-sectional shape of the aperture 114 matches the cross-sectional radius of the pin 140 such that the pin 140 fits snugly within the aperture 114 when the pin is in the pin-closed position as shown. Dimension 501 is the long dimension of the cross-sectional shape of the aperture 114, while dimension 502 is the short dimension of the cross-sectional shape of the aperture 114. As shown, dimension 501 is larger than dimension 502. In one example, the radius of the cross-sectional obround shape of the aperture 114 (i.e., half of the dimension 502) is between six millimeters and ten millimeters. Also, in one example, a ratio of the radius of the cross-sectional obround shape of the aperture 114 to the dimension 501 is between one eighth and one half.

To facilitate explanation of the examples described herein, it is also helpful to define a direction of dimension 501 (i.e., the long dimension of the cross-sectional shape of the aperture 114). The direction 507 of dimension 501 is the direction in which the actuator 113 moves relative to the pin 140 when the actuator 113 moves from the actuator-closed position (e.g., as shown in FIG. 5A) to the actuator-open position. However, the direction in which the actuator 113 moves relative to the hood 120 (e.g., as shown in FIG. 1 or FIG. 4) when the actuator 113 moves from the actuator-closed position (e.g., as shown in FIG. 5A) to the actuator-open position is indicated by the arrow 101C. This is because the hood 120 moves from the hood-closed position to the hood-open position in the direction indicated by arrow 101B relative to the pin 140 when the actuator 113 moves from the actuator-closed position to the actuator-open position. The direction indicated by arrow 101C is referred to as the actuator-open direction, while the direction indicated by arrow 101B is referred to as the hood-open direction.

As shown, the direction 507 of dimension 501 is offset from the actuator-open direction by an angle 505. In this example, the value of the angle 505 is forty-five degrees. However, in other examples, other acute values may be used for the angle 505. In one example, the value of the angle 505 may be anywhere from forty degrees to fifty degrees. In another example, the value of the angle 505 may be anywhere from thirty degrees to sixty degrees. The actuator-open direction is offset from the hood-open direction by the angle 506. In this example, the angle 506 is ninety degrees. As a result, in this example, the distance that the hood 120 moves in the hood-open direction (e.g., the movement distance 102 shown in FIG. 2B) when the actuator 113 moves from the actuator-closed position to the actuator-open position equals the absolute value of the sine of the angle 505 multiplied by the value of the dimension 501. Thus, the distance that the hood 120 moves between the hood-open position and the hood-closed position can be changed to an extent by changing the value of the angle 505 without changing the distance that the actuator 113 moves between the actuator-open position and the actuator-closed position relative to the hood 120.

The actuator 113 can also be described in terms of a long dimension and a short dimension. Specifically, dimension 504 is the long dimension of the actuator 113 and dimension 503 is the short dimension of the actuator 113. As shown, dimension 504 is larger than dimension 503. In some examples described herein, it is helpful to define a direction of dimension 504. The direction of dimension 504, as described herein, is the direction indicated by arrow 101C (i.e., the actuator-open direction). Thus, in the example shown in FIG. 5A, the angle 505 also defines the offset between dimension 501 (the direction of the long dimension of the cross-sectional shape of the aperture 114) and the direction of dimension 504.

As discussed with respect to FIG. 1, when the handle 112 (not shown in FIG. 5A) is rotated upward from a handle-closed position to a handle-open position, a geometric feature at an end of the handle 112 that is proximal relative to the axis about which the handle 112 rotates engages with the actuator 113 and pushes the actuator in the actuator-open direction. The actuator 113 may also include a geometric feature that engages with the geometric feature of the handle 112 to achieve movement of the actuator 113 when the handle 112 is rotated. Specifically, at an end of the actuator 113 that is proximal to the axis about which the handle 112 rotates, the actuator 113 may include the gear 117.

Figure 5B:
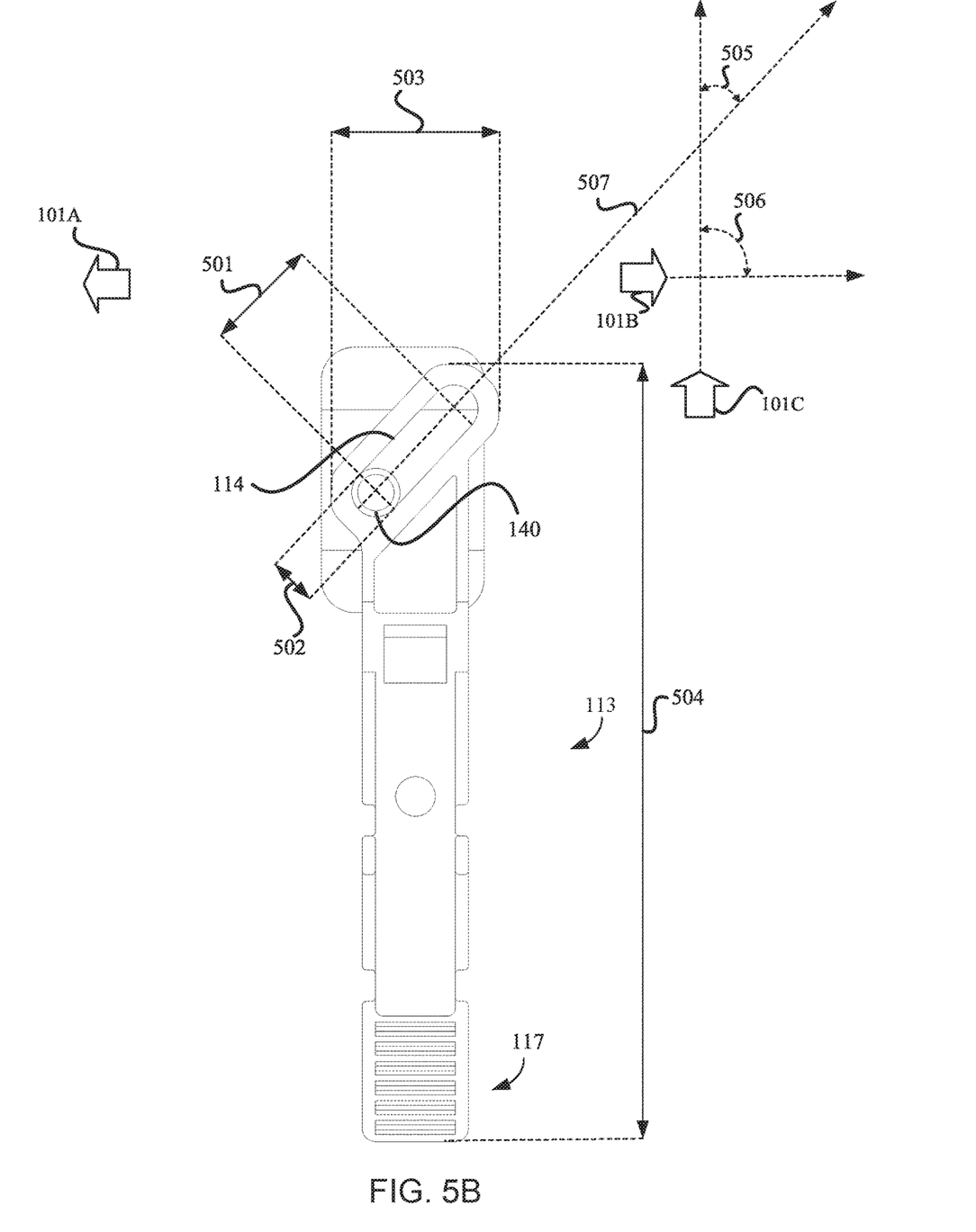
FIG. 5B illustrates a close-up top-down view of a hood-latch actuator and a pin when the actuator is in an actuator-open position, according to one example.

FIG. 5B illustrates a close-up top-down view of the actuator 113 and the pin 140 when the actuator 113 is in the actuator-open position, according to one example. Other parts of the chassis 200, the hood 120, and the hood latch 110 are not shown in FIG. 5B so that features of the actuator 113 can be shown more clearly. When the actuator 113 is in the actuator-open position as shown, the pin 140 rests at a pin-open position within the aperture 114 as shown.

Figure 6A:
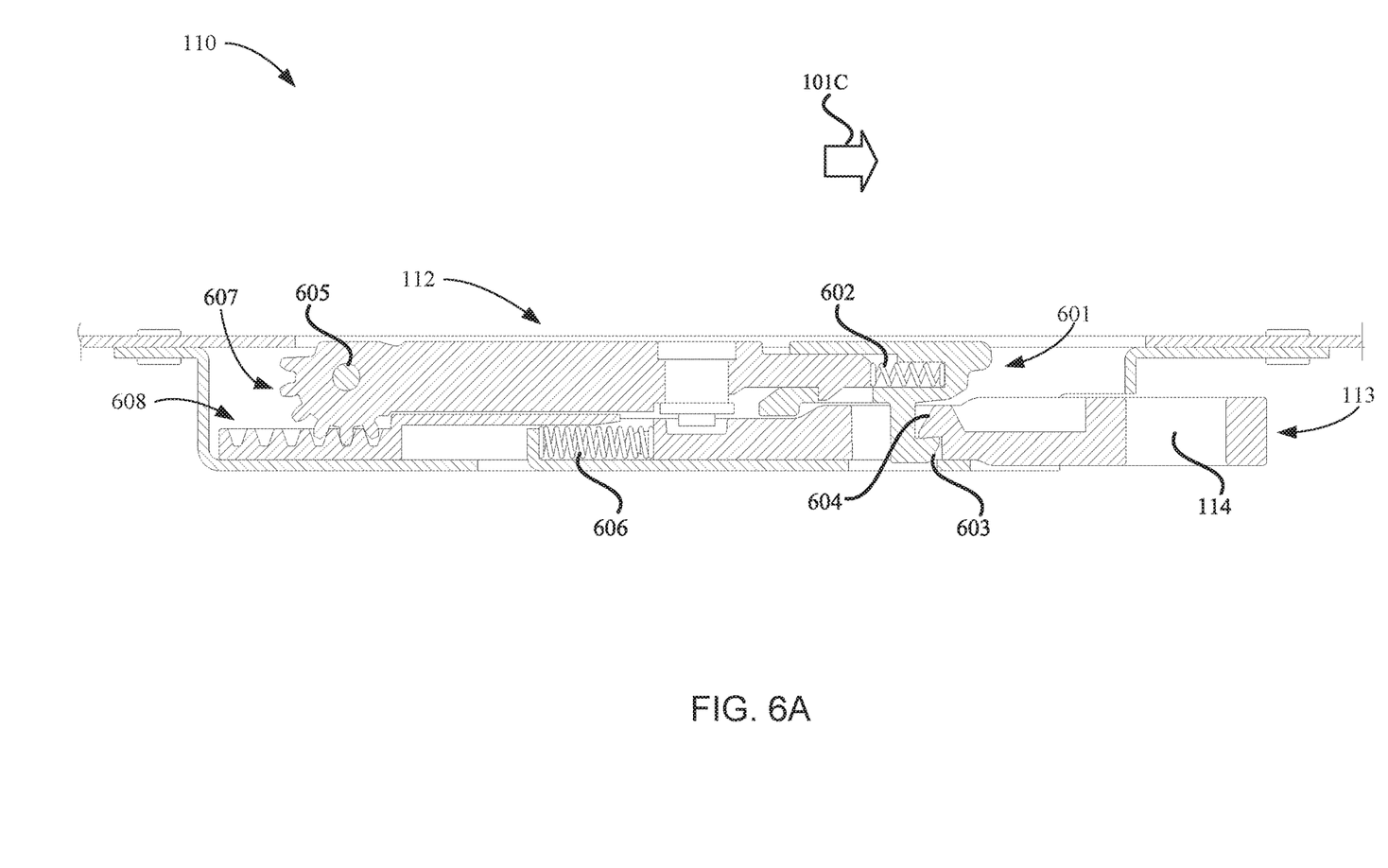
FIG. 6A illustrates a cross-sectional view of a hood latch while a handle of the hood latch is in a handle-closed position and an actuator of the hood latch is in an actuator-closed position, according to one example.

FIG. 6A illustrates a cross-sectional view of the hood latch 110 while the handle 112 is in the handle-closed position and the actuator 113 is in the actuator-closed position, according to one example. As shown, the handle 112 may include a retractable locking mechanism 601 that is biased into a locked position (shown) by a resilient mechanism 602 (e.g., a spring). A flange 603 of the locking mechanism 601 underlays a flange 604 of the actuator 113, thereby preventing the handle 112 from rotating upward about the hinge axle 605 when the locking mechanism 601 is in the locked position. Another resilient mechanism 606 biases the actuator 113 in the actuator-open direction. The gear 607 of the handle 112 meshes with the gear 608 of the actuator 113. The gear 607 is located at an end of the handle 112 that is proximal relative to the hinge axle 605. Similarly, the gear 608 is located at an end of the actuator 113 that is proximal relative to the hinge axle 605. The aperture 114 is located at an end of the actuator 114 that is distal relative to the hinge axle 605.

Figure 6B:
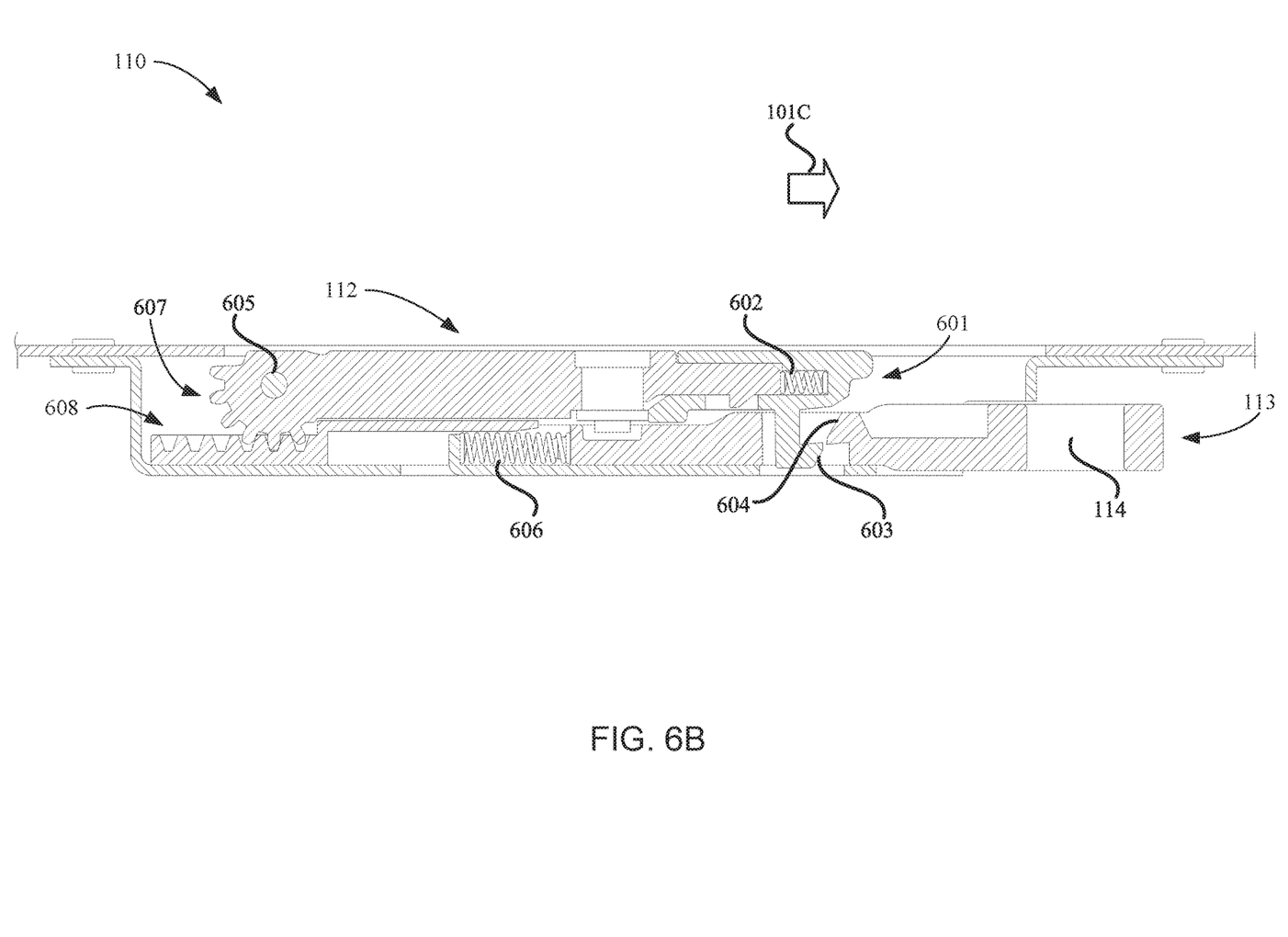
FIG. 6B illustrates a cross-sectional view of a hood latch while a handle of the hood latch is in a handle-closed position and a locking mechanism of the handle is in an unlocked position, according to one example.

FIG. 6B illustrates a cross-sectional view of the hood latch 110 while the handle 112 is in the handle-closed position and the locking mechanism 601 is in an unlocked position, according to one example. As shown, the locking mechanism 601 is pressed into the resilient mechanism 602 such that the flange 603 of the locking mechanism 601 does not underlay the flange 604 of the actuator 113. As a result, the locking mechanism 601 does not prevent the handle 113 from rotating upward about the hinge axle 605 when the locking mechanism 601 is in the unlocked position.

Figure 6C:
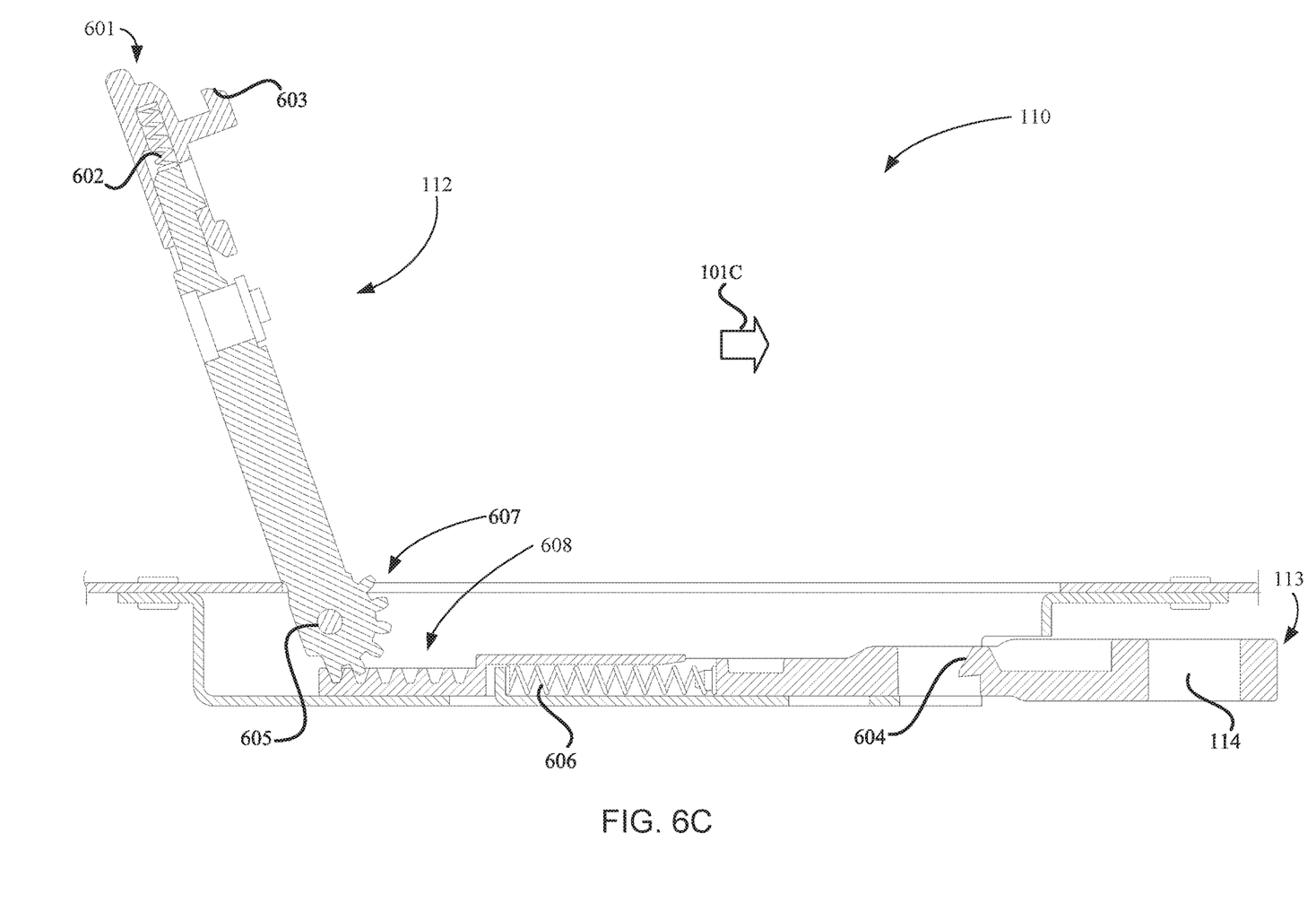
FIG. 6C illustrates a cross-sectional view of a hood latch while a handle of the hood latch is in a handle-open position and an actuator of the hood latch is in an actuator-open position, according to one example.

FIG. 6C illustrates a cross-sectional view of the hood latch 110 while the handle 112 is in the handle-open position and the actuator 113 is in the actuator-open position, according to one example. As shown, the handle 112 has been rotated about the hinge axle 605 and the actuator 113 has been moved in the actuator-open direction. The rotational movement of the handle 112 causes translational movement of the actuator 113 via the meshing of gear 607 with gear 608. Also, the resilient mechanism 606 applies a force that biases the actuator 113 to remain in the actuator-open position.

Figure 7:
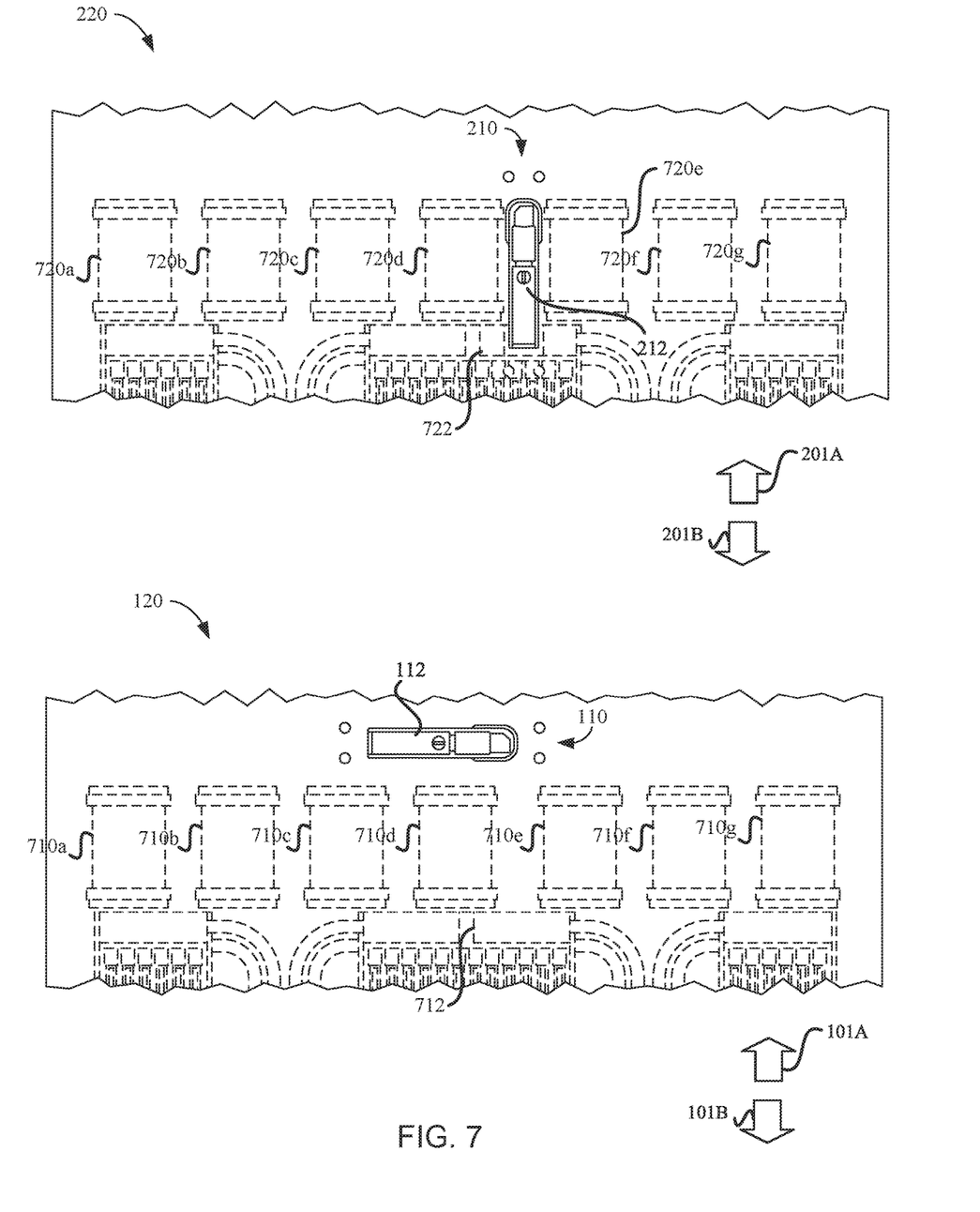
FIG. 7 illustrates a partially cutoff top-down view of the hoods described in FIG. 1, according to one example.

FIG. 7 illustrates a partially cutoff top-down view of the hood 120 and the hood 220 as described in FIG. 1, according to one example. The hood latch 210 is oriented to align with the hood 220 such that the handle 212 of the hood latch 210 rotates about an axis that is orthogonal to the directions in which the hood 220 slides when moving between a hood-open position and a hood-closed position. By contrast, the hood latch 110 is oriented such that the handle 112 of the hood latch 110 rotates about an axis that is parallel to the directions in which the hood 120 slides when moving between a hood-open position and a hood-closed position.

In FIG. 7, dashed outlines represent components that are positioned in the interior of the chassis 100 and the chassis 200 beneath the hood 120 and the hood 220, respectively. For example, fans 710a-g and heat sink 712 may be located in chassis 100. Similarly, fans 720a-g and heat sink 722 may be located in chassis 200.

Part of the hood latch 210, such as the handle 212, is located on the exterior side of the hood 220. However, part other parts of the hood latch 210, such as an actuator, protrude partly into an interior side of the hood 220. In order to accommodate the protrusion of the hood latch 210 into the interior side of the hood 220, an engineer may have little choice but to space fan 720d and fan 720e a suboptimal distance apart. Also, the engineer may be obliged to cut shorten fins of the heat sink 722 that are directly beneath the hood latch 210 to accommodate the protrusion of the hood latch 210 into the interior side of the hood 220. In addition, an engineer may also be obliged to arrange other components on the interior of the chassis to avoid the hood latch 210. Such accommodations may result in a suboptimal arrangement of the components in terms of how densely the components are packed, how well air from the fans circulates between the components, or how well other desired design parameters are met.

Similarly, part of the hood latch 110 may protrude partly into an interior side of the hood 120. However, the orientation of the hood latch 110 obviates any need to change the spacing of the fans 710a-g, shorten the fins of the heat sink 712, or rearrange other components to accommodate the protrusion of the hood latch 110 into the interior side of the hood 120. Without the constraint of such accommodations, an engineer may be able to design a system with better packing efficiency, better air circulation, more effective heat dissipation through the heat sink 712, and other features that meet other desired design parameters to a greater extent than can be achieved in a system that uses the hood latch 210.

Figure 8:
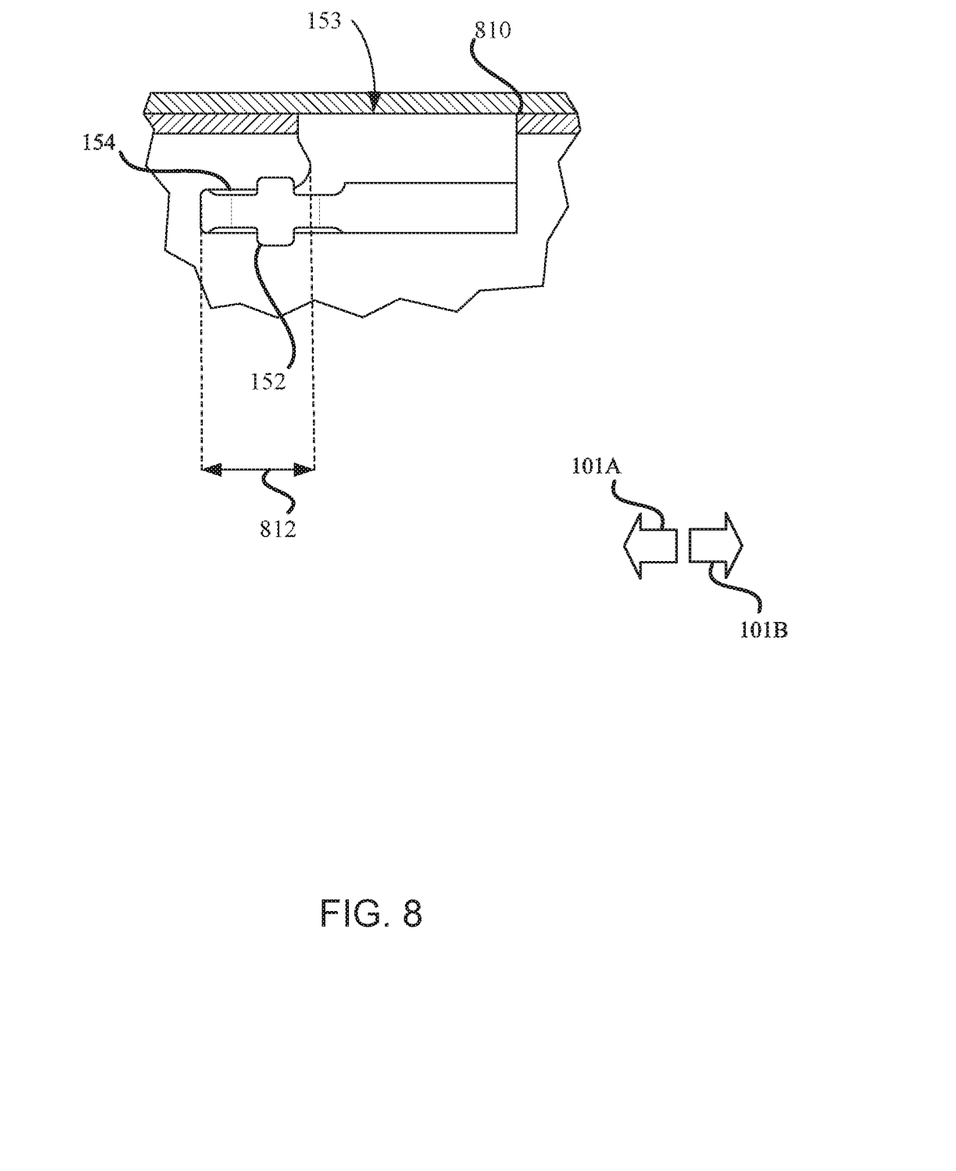
FIG. 8 illustrates a cutaway view of a hood-locking form resting within a recess of an L-shaped cutout, according to one example.

FIG. 8 illustrates a cutaway view of the hood-locking form 152 resting within the recess 154 of the L-shaped cutout 153, according to one example. The L-shaped cutout 153 extends into an edge 810 of a ridge of the base portion of the chassis 100 (shown in FIG. 3) that is proximal relative to the cross-sectional plane of the opening 171 (also shown in FIG. 3). When the hood-locking form 152 rests within the recess 154 as shown, the recess 154 prevents the hood 120 from moving in a direction orthogonal to the cross-sectional plane of the opening 171 (e.g., upward) by interlocking with the hood-locking form 152. Furthermore, a width 812 of the recess 154 may be equal to the movement distance 102 shown in FIG. 2B (e.g., the absolute value of the sine of the angle 505 multiplied by the value of the dimension 501).

EXAMPLES

The following additional examples are included below to highlight several aspects of the apparatuses described herein. However, the scope of the disclosure is not limited to these additional examples or the other examples described herein.

Example 1 includes a hood latch comprising: a hinge; a handle configured to rotate about the hinge between a handle-closed position and a handle-open position, wherein the handle comprises a first geometric feature at an end of the handle that is proximal relative to the hinge; and an actuator comprising: a second geometric feature at a first end of the actuator that is proximal relative to the hinge, wherein the first geometric feature of the handle is configured to engage with the second geometric feature to push the actuator in an actuator-open direction when the handle is rotated from the closed position to the open position, and an aperture at a second end of the actuator that is distal relative to the hinge, wherein: a cross-sectional shape of the aperture is oblong; a long dimension of the cross-sectional shape is longer than a short dimension of the cross-sectional shape; and a direction of the long dimension is offset from the actuator-open direction by an angle that is acute.

Example 2 includes the hood latch of example 1, wherein the cross-sectional shape of the aperture is an obround.

Example 3 includes the hood latch of example 1 or 2, wherein the angle is between thirty degrees and sixty degrees.

Example 4 includes the hood latch of example 3, wherein the angle is between forty degrees and fifty degrees.

Example 5 includes the hood latch of example 1, 2, 3, or 4, further comprising: a resilient mechanism that exerts a force on the actuator that biases the actuator toward an actuator-open position.

Example 6 includes the hood latch of example 1, 2, 3, 4, or 5, wherein the first geometric feature and the second geometric feature are gears.

Example 7 includes an actuator for a hood latch, the actuator comprising: an aperture at an end of the actuator, wherein: a cross-sectional shape of the aperture is oblong; a long dimension of the actuator is longer than a short dimension of the actuator; a long dimension of the cross-sectional shape is longer than a short dimension of the cross-sectional shape; and a direction of the long dimension of the cross-sectional shape is offset from a direction of the long dimension of the actuator by an angle that is acute.

Example 8 includes the actuator of example 7, wherein the cross-sectional shape of the aperture is an obround.

Example 9 includes the actuator of example 8, wherein a radius of the obround is between 6 millimeters and ten millimeters.

Example 10 includes the actuator of example 8 or 9, wherein a ratio of a radius of the obround to a side length of the obround is between one eighth and one half.

Example 11 includes the actuator of example 7, 8, 9, or 10, wherein the angle is between thirty degrees and sixty degrees.

Example 12 includes the actuator of example 11, wherein the angle is between forty degrees and fifty degrees.

Example 13 includes a chassis for a computing device, the chassis comprising: a base portion comprising an opening; a removable hood that covers the opening when the hood is in a hood-closed position relative to the base portion, wherein the hood is configured to slide along a cross-sectional plane of the opening in a hood-open direction when the hood is moved from the hood-closed position to a hood-open position; a pin rigidly attached to the base portion and extending toward the opening; a hood latch affixed to the hood, the hood latch comprising: an actuator configured to slide in an actuator-open direction when the actuator is moved from an actuator-closed position relative to the hood to an actuator-open position, the actuator comprising an aperture, wherein: a cross-sectional shape of the aperture is oblong such that a long dimension of the cross-sectional shape is longer than a short dimension of the cross-sectional shape, a direction of the long dimension is offset from the actuator-open direction by a first offset angle that is acute, a cross-sectional radius of the pin equals half of the short dimension, the pin rests at a pin-closed position within the aperture when the hood is in the hood-closed position and the actuator is in the actuator-closed position, the pin moves from the pin-closed position to a pin-open position within the aperture when the actuator moves from the actuator-closed position to the actuator-open position and the hood moves from the hood-closed position to the hood-open position, and the actuator-open direction is offset from the hood-open direction by a second offset angle.

Example 14 includes the chassis of example 13, wherein the second offset angle is ninety degrees.

Example 15 includes the chassis of example 14 or 14, wherein the first offset angle is forty-five degrees.

Example 16 includes the chassis of example 15, wherein a movement distance of the hood between the hood-open position and the hood-closed position equals a square root of a product squared, wherein the product equals a sine of the first offset angle multiplied by the long dimension of the cross-sectional shape of the aperture.

Example 17 includes the chassis of example 13, 14, 15, or 16, wherein the cross-sectional shape of the aperture is an obround.

Example 18 includes the chassis of example 17, wherein the hood latch further comprises: a resilient mechanism that exerts a force on the actuator that biases the actuator toward the actuator-open position.

Example 19 includes the chassis of example 17 or 18, wherein: the hood comprises a hood-locking form disposed along a ridge of the hood; and the base portion comprises a L-shaped cutout disposed along a ridge of the base portion that underlays the ridge of the hood when the hood is in the hood-closed position; the L-shaped cutout extends into an edge of the ridge of the base portion that is proximal to the cross-sectional plane of the opening; a recess defined by the by the L-shaped cutout prevents the hood from being moved in a direction orthogonal to the cross-sectional plane of the opening when the hood is in the hood-closed position by interlocking with the hood-locking form; and a width of the recess equals a square root of a product squared, wherein the product equals a sine of the first offset angle multiplied by the long dimension of the cross-sectional shape of the aperture.

Example 20 includes the chassis of example 13, 14, 15, 16, 17, or 18, wherein the hood latch further comprises: a hinge; a handle positioned on an exterior side of the hood, wherein the handle is configured to rotate about the hinge between a handle-closed position and a handle-closed open position relative to the hood, wherein a geometric feature at an end of the handle that is proximal relative to the hinge is configured to push the actuator from the actuator-closed position to the actuator-open position when the handle is rotated from the handle-closed position to the handle-closed position.

While the present apparatuses and systems may be susceptible to various modifications and alternative forms, the embodiments discussed above have been provided only as examples. It is to be understood that the apparatuses and systems are not intended to be limited to the particular examples disclosed herein. Indeed, the present apparatuses and systems include all alternatives, modifications, and equivalents falling within the true spirit and scope of the appended claims.

What is claimed is:

1. A hood latch comprising:
a hinge;
a handle configured to rotate about the hinge between a handle-closed position and a handle-open position, wherein the handle comprises a first geometric feature at an end of the handle that is proximal relative to the hinge; and
an actuator comprising:
a first end with a second geometric feature, wherein the first end is proximal relative to the hinge, wherein the first geometric feature of the handle is configured to engage with the second geometric feature to push the actuator in an actuator-open direction when the handle is rotated from the closed position to the open position, and
a second end with an aperture, wherein the second end is distal relative to the hinge, wherein:
a cross-sectional shape of the aperture is oblong;
a long dimension of the cross-sectional shape is longer than a short dimension of the cross-sectional shape; and
a direction of the long dimension is offset from the actuator-open direction by an angle that is acute.

2. The hood latch of claim 1, wherein the cross-sectional shape of the aperture is an obround.

3. The hood latch of claim 1, wherein the angle is between thirty degrees and sixty degrees.

4. The hood latch of claim 3, wherein the angle is between forty degrees and fifty degrees.

5. The hood latch of claim 1, further comprising:
a resilient mechanism that exerts a force on the actuator that biases the actuator toward an actuator-open position.

6. The hood latch of claim 1, wherein the first geometric feature and the second geometric feature are gears.

7. A chassis for a computing device, the chassis comprising:
a base portion comprising an opening;
a removable hood that covers the opening when the hood is in a hood-closed position relative to the base portion, wherein the hood is configured to slide along a cross-sectional plane of the opening in a hood-open direction when the hood is moved from the hood-closed position to a hood-open position;
a pin rigidly attached to the base portion and extending toward the opening;
a hood latch affixed to the hood, the hood latch comprising:
an actuator configured to slide in an actuator-open direction when the actuator is moved from an actuator-closed position relative to the hood to an actuator-open position, the actuator comprising an end with an aperture, wherein:
a cross-sectional shape of the aperture is oblong such that a long dimension of the cross-sectional shape is longer than a short dimension of the cross-sectional shape,
a direction of the long dimension is offset from the actuator-open direction by a first offset angle that is acute,
a cross-sectional radius of the pin equals half of the short dimension,
the pin rests at a pin-closed position within the aperture when the hood is in the hood-closed position and the actuator is in the actuator-closed position,
the pin moves from the pin-closed position to a pin-open position within the aperture when the actuator moves from the actuator-closed position to the actuator-open position and the hood moves from the hood-closed position to the hood-open position, and
the actuator-open direction is offset from the hood-open direction by a second offset angle.

8. The chassis of claim 7, wherein the second offset angle is ninety degrees.

9. The chassis of claim 8, wherein the first offset angle is forty-five degrees.

10. The chassis of claim 9, wherein a movement distance of the hood between the hood-open position and the hood-closed position equals a square root of a product squared, wherein the product equals a sine of the first offset angle multiplied by the long dimension of the cross-sectional shape of the aperture.

11. The chassis of claim 7, wherein the cross-sectional shape of the aperture is an obround.

12. The chassis of claim 11, wherein the hood latch further comprises:
a resilient mechanism that exerts a force on the actuator that biases the actuator toward the actuator-open position.

13. The chassis of claim 11, wherein:
the hood comprises a hood-locking form disposed along a ridge of the hood; and
the base portion comprises a L-shaped cutout disposed along a ridge of the base portion that underlays the ridge of the hood when the hood is in the hood-closed position;
the L-shaped cutout extends into an edge of the ridge of the base portion that is proximal to the cross-sectional plane of the opening;
a recess defined by the by the L-shaped cutout prevents the hood from being moved in a direction orthogonal to the cross-sectional plane of the opening when the hood is in the hood-closed position by interlocking with the hood-locking form; and
a width of the recess equals a square root of a product squared, wherein the product equals a sine of the first offset angle multiplied by the long dimension of the cross-sectional shape of the aperture.

14. The chassis of claim 7, wherein the hood latch further comprises:
a hinge;
a handle positioned on an exterior side of the hood, wherein the handle is configured to rotate about the hinge between a handle-closed position and a handle-closed open position relative to the hood, wherein a geometric feature at an end of the handle that is proximal relative to the hinge is configured to push the actuator from the actuator-closed position to the actuator-open position when the handle is rotated from the handle-closed position to the handle-closed position.

\* \* \* \* \*